(12) United States Patent
Fossum et al.

(10) Patent No.: US 6,570,617 B2
(45) Date of Patent: May 27, 2003

(54) CMOS ACTIVE PIXEL SENSOR TYPE IMAGING SYSTEM ON A CHIP

(75) Inventors: Eric R. Fossum, La Crescenta, CA (US); Robert Nixon, Shadow Hills, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/753,417

(22) Filed: Jan. 2, 2001

(65) Prior Publication Data

US 2001/0002045 A1 May 31, 2001

Related U.S. Application Data

(62) Division of application No. 09/120,856, filed on Jul. 21, 1998, which is a continuation of application No. 08/789,608, filed on Jan. 24, 1997, now Pat. No. 5,841,126, which is a continuation-in-part of application No. 08/558,521, filed on Nov. 16, 1995, now Pat. No. 6,101,232, which is a continuation of application No. 08/188,032, filed on Jan. 28, 1994, now Pat. No. 5,471,515.

(51) Int. Cl.$^7$ .................................................. H04N 5/335
(52) U.S. Cl. ........................................ 348/308; 348/294
(58) Field of Search ................................. 348/294, 295, 348/296, 297, 300, 301, 302, 308; 365/185.03, 185.33, 115; 250/208.1; 257/292, 443

(56) References Cited

U.S. PATENT DOCUMENTS

| | | |
|---|---|---|
| 4,155,094 A | 5/1979 | Ohba et al. |
| 4,363,963 A | 12/1982 | Ando |
| 4,525,742 A | 6/1985 | Nishizawa et al. |
| 4,631,400 A | 12/1986 | Tanner et al. |
| 4,660,090 A | 4/1987 | Hynecek |
| 4,835,617 A | 5/1989 | Todaka et al. |
| 4,839,729 A | 6/1989 | Ando et al. |
| 4,839,735 A | 6/1989 | Kyomasu et al. |
| 4,859,624 A | 8/1989 | Goto |
| 4,942,474 A | 7/1990 | Akimoto et al. |
| 4,959,727 A | 9/1990 | Imaide et al. |
| 5,097,339 A | 3/1992 | Ishida et al. |
| 5,134,488 A | 7/1992 | Sauer |
| 5,182,623 A | 1/1993 | Hynecek |
| 5,184,203 A | 2/1993 | Taguchi |
| 5,198,880 A | 3/1993 | Taguchi et al. |
| 5,225,696 A | 7/1993 | Bahraman |
| 5,262,871 A | 11/1993 | Wilder et al. |
| 5,317,174 A | 5/1994 | Hynecek |
| 5,335,015 A | 8/1994 | Cooper et al. |
| 5,341,008 A | 8/1994 | Hynecek |
| 5,369,039 A | 11/1994 | Hynecek |
| 5,420,634 A | 5/1995 | Matsumoto |
| 5,424,223 A | 6/1995 | Hynecek |
| 5,436,476 A | 7/1995 | Hynecek |
| 5,452,004 A | 9/1995 | Roberts |
| 5,461,425 A | * 10/1995 | Fowler et al. |
| 5,471,245 A | 11/1995 | Cooper et al. |

(List continued on next page.)

OTHER PUBLICATIONS

Fossum et al., "Future Prospects for CMOS Active Pixel Image Sensors," 1995 IEEE Workshop on CCDs and Advanced Image Sensors, 4 pages, (1995).

(List continued on next page.)

*Primary Examiner*—Tuan Ho
(74) *Attorney, Agent, or Firm*—Fish & Richardson P.C.

(57) ABSTRACT

A single chip camera which includes an intergrated image acquisition portion and control portion and which has double sampling/noise reduction capabilities thereon. Part of the intergrated structure reduces the noise that is picked up during imaging.

35 Claims, 10 Drawing Sheets

U.S. PATENT DOCUMENTS

| | | | |
|---|---|---|---|
| 5,471,515 A | * | 11/1995 | Fossum et al. |
| 5,491,566 A | * | 2/1996 | Oh et al. |
| 5,500,383 A | | 3/1996 | Hynecek |
| 5,528,643 A | | 6/1996 | Hynecek |
| 5,541,402 A | | 7/1996 | Ackland et al. ......... 250/208.1 |
| 5,576,763 A | | 11/1996 | Ackland et al. ............ 348/308 |
| 5,587,596 A | | 12/1996 | Chi et al. |
| 5,600,127 A | * | 2/1997 | Kimata |
| 5,608,204 A | * | 3/1997 | Hofflinger et al. |
| 5,608,243 A | | 3/1997 | Chi et al. |
| 5,614,744 A | | 3/1997 | Merrill |
| 5,625,210 A | | 4/1997 | Lee et al. |
| 5,633,679 A | | 5/1997 | Hosier et al. |
| 5,652,622 A | | 7/1997 | Hynecek |
| 5,670,817 A | * | 9/1997 | Robinson |
| 5,883,830 A | * | 3/1999 | Hirt et al. .............. 365/185.03 |

OTHER PUBLICATIONS

S. Chamberlain, "Photosensitivity and Scanning of Silicon Image Detector Arrays," IEEE J. Solid State Circuits, vol. SC–4, No. 6, pp. 333–342 (Dec. 1969).

M. Aoki, et al., "2/3 Inch Format MOS Single–Chip Color Imager," IEEE Trans. On Electron Devices, vol. ED–29, No. 4, pp. 745–750 (Apr. 1982).

J. Hynecek, "A New Device Architecture Suitable for High––Resolution and High–Performance Image Sensors," IEEE Trans. on Electron Devices, vol. 35(5), pp. 646–652 (May 1988).

F. Andoh, et al., "A 250,000–Pixel Image Sensor with FET Amplification at Each Pixel for High–Speed Television Cameras," 1990 IEEE International Solid–State Circuits Conference, Digest of Technical Papers, pp. 212–213 (Feb. 16, 1990).

N. Tanaka, et al., "A 310K Pixel Bipolar Imager (BASIS)," IEEE Trans. On Electron Devices, vol. 37(4), pp. 964–971 (Apr. 1990).

K. Chen, et al., "PASIC: A Processor–A/D converter–Sensor Integrated Circuit," IEEE ISCAS, pp. 1705–1708 (1990).

O. Yadid–Pecht, et al., "A Random Access Photodiode Array for Intelligent Image Capture," IEEE Trans. on Electron Devices, vol. 38, No. 8, pp. 1772–1780 (Aug. 1991).

M. Kyomasu, "A New MOS Imager Using Photodiode as Current Source," IEEE Journal of Solid State Circuits, vol. 26, No. 8, pp. 1116–1122 (Aug. 1991).

R. Forchheimer, et al., "MAPP2200—A Second generation smart optical sensor," Proc. SPIE, vol. 1659, pp. 2–11 (1992).

C. Jansson, et al., "An Addressable 256 x 256 Photodiode Image Sensor Array with an 8–Bit Digital Output," Analog Integrated Circuits and Signal Processing, vol. 4, pp. 37–49 (1993).

H. Kawashima, et al., "A ¼ Inch Format 250K Pixel Amplified MOS Image Sensor Using CMOS Process," IEEE IEDM Tech. Digest, pp. 22.4.1–22.4.4 (1993).

S. Mendis, et al., "Design of a Low–Light–Level Image Sensor with On–chip Sigma–Delta Analog–to–Digital Conversion," SPIE, Charge Coupled Devices & Solid State Optical Sensors III, vol. 1900, pp. 31–39 (1993).

M. Sugawara, et al., "An Amplified MOS Imager Suited for Image Processing," 1994 IEEE International Solid–State Circuits Conference, Digest of Technical Papers, Session 13, Neural Networks and Image Sensors/ Paper TP 13.6, pp. 228–229 (1994).

B. Fowler, et al., "A CMOS Area Image Sensors with Pixel–Level A/D Conversion," 1994 IEEE International Solid–State Circuits Conference, Digest of Technical Papers, Neural Networks and Image Sensors/ Paper TP 13.5, pp. 226–227 (1994).

B. Pain, et al., "Approaches and analysis for on–focal–plane analog–to–digital conversion," Proc. SPIE, vol. 2226, pp. 208–218 (1994).

S. Mendis, "CMOS Active Pixel Image Sensors with On–Chip Analog–to–Digital Conversion," UMI Dissertation Services, UMI No. 9533615, Columbia University (1995).

E. Eid, et al., "A 256 x 256 CMOS Active Pixel Image Sensor," Charge–Coupled Devices and Solid State Optical Sensors, SPIE, vol. 2415, pp. 265–275 (1995).

A. Dickinson, et al., "Standard CMOS Active Pixel Image Sensors for Multimedia Applications," Proc. 16$^{th}$ Conference on Advanced Research in VLSI, Chapel Hill, NC, USA, IEEE, pp. 214–224 (Mar. 27–29, 1995).

E. Fossum, "CMOS Image Sensors: Electronic Camera on a Chip," IED Meeting, Washington, D.C., USA, IEEE, IEDM, pp. 1.3.1–1.3.9 (Dec. 10–13, 1995).

A. Gruss, et al., "Integrated Sensor and Range–Finding Analog Signal Processor," IEEE Journal of Solid State Circuits, vol. 26, No. 3, pp. 184–191 (Mar. 1991).

Renshaw, et al., "ASIC Image Sensors," Proc. IEEE ISCAS, pp. 3038–3041 (1990).

O. Vellacott, "CMOS in camera," IEE Review, pp. 111–114 (May 1994).

I. Muirhead, "Development in CMOS Camera Technology," published by: IEE, Savoy Place, London WC2R 0BL, UK, pp. 5/1–5/4 (1994).

I. Takayanagi, et al., "A Multiple Output CMD Imager for Real–Time Image Processing," IEEE, IEDM, pp. 22.5.1–22.5.4 (1993).

M. White, et al., "Characterization of Surface Channel CCD Image Arrays at Low Light Levels," IEEE Journal of Solid–State Circuits, vol. SC–9, No. 1, pp. 1–13 (Feb. 1974).

W. Yang, et al., "A full–fill factor CCD imager with integrated signal processors," IEEE International Solid–State Circuits Conference Digest of Technical Papers, pp. 218–219 and 300 (Feb. 16, 1990).

R. Forchheimer, "Single–chip image sensors with a digital processor array," Journal of VLSI Signal Processing, vol. 5, pp. 121–131 (1993).

E. Fossum, et al., "Development of CMOS Active Pixel Image Sensors for Low Cost Commerical Applications," Conference Proceedings of NASA Technology 2004, pp. 1–2 (Nov. 1994).

E. Fossum, et al., "Application of the active pixel sensor concept to guidance and navigation," SPIE, vol. 1949, Space Guidance, Control and Tracking, paper 30, pp. 1–8 (1993).

E. Fossum, "Assessment of Image Sensor Technology for Future NASA Missions," Proceedings of the SPIE, vol. 2172, Charge–Coupled Devices and Solid–State Optical Sensors IV, pp. 1–6 (1994).

T. Kuriyama, et al., "A 1/3–in 270 000 Pixel CCD Image Sensor," IEEE Transaction on Electron Devices, Special Issue on Solid State Image Sensors, vol. 38, No. 5, pp. 949–953 (May 1991).

H. Ando, et al., "A 1/2–in CCD Imager with Lateral Overflow–Gate Shutter," IEEE Transaction on Electron Devices, Special Issue on Solid State Image Sensors, vol. 38, No. 5, pp. 960–964 (May 1991).

A. Toyoda, et al., "A Novel Tungsten Light–Shield Structure for High–Density CCD Image Sensors," IEEE Transaction on Electron Devices, Special Issue on Solid State Image Sensors, vol. 38, No. 5, pp. 965–968 (May 1991).

T. Ozaki, et al., "A Low–Noise Line–Amplified MOS Imaging Devices," IEEE Transaction on Electron Devices, Special Issue on Solid State Image Sensors, vol. 38, No. 5, pp. 969–975 (May 1991).

M. Yamagishi, et al., "A 2 Million Pixel FIT–CCD Image Sensor for HDTV Camera Systems," IEEE Transaction on Electron Devices, Special Issue on Solid State Image Sensors, vol. 38, No. 5, pp. 976–980 (May 1991).

E. Stevens, et al., "A 1–Megapixel, Progressive–Scan Image Sensor with Antiblooming Control and Lag–Free Operation," IEEE Transaction on Electron Devices, Special Issue on Solid State Image Sensors, vol. 28, No. 5, pp. 981–988 (May 1991).

K. Matsumoto, et al., "The Operation Mechanism of a Charge Modulation Device (CMD) Image Sensor," IEEE Transaction on Electron Devices, Special Issue on Solid State Image Sensors, vol. 38, No. 5, pp. 989–998 (May 1991).

K. Matsumoto, et al., "Analysis of Operational Speed and Scaling Down the Pixel Size of a Charge Modulation Device (CMD) Image Sensor," IEEE Transaction on Electron Devices, Special Issue on Solid State Image Sensors, vol. 38, No. 5, pp. 999–1004 (May 1991).

M. Ogata, "A Small Pixel CMD Image Sensor," IEEE Transaction on Electron Devices, Special Issue on Solid State Image Sensors, vol. 38, No. 5, pp. 1005–1010 (May 1991).

Hynecek, "BCMD—An Improved Photosite Structure for High–Density Image Sensors," IEEE Transactions on Electron Devices, vol. 38(5), pp. 1011–1020 (May 1991).

T. Mizoguchi, et al., "A 250 k–Pixel SIT Image Sensor Operating in its High–Sensitivity Mode," IEEE Transaction on Electron Devices, Special Issue on Solid State Image Sensors, vol. 38, No. 5, pp. 1021–1027 (May 1991).

Y. Nakamura, et al., "Design of Bipolar Imaging Device (BASIS)," IEEE Transaction on Electron Devices, Special Issue on Solid State Image Sensors, vol. 38, No. 5, pp. 1028–1036 (May 1991).

M. Miyawaki, et al., "Reduction of Fixed–Pattern Noise of BASIS Due to Low Kinetic Energy Reactive Ion to Low Kinetic Energy Reactive Ion and Native–Oxide–Free Processing," IEEE Transaction on Electron Devices, Special Issue on Solid State Image Sensors, vol. 38, No. 5, pp. 1037–1043 (May 1991).

J. Hojo, et al., "A 1/3–in 510(H) × 492(V) CCD Image Sensor with Mirror Image Function," IEEE Transaction on Electron Devices, Special Issue on Solid State Image Sensors, vol. 38, No. 5, pp. 954–959 (May 1991).

Y. Matsunaga et al., "A High–Sensitivity MOS Photo–Transistor for Area Image Sensor," IEEE Transaction on Electron Devices, Special Issue on Solid State Image Sensors, vol. 38, No. 5, pp. 1044–1047 (May 1991).

N. Mutoh, et al., "New Low–Noise Output Amplifier for High–Definition CCD Image Sensor," IEEE Transaction on Electron Devices, Special Issue on Solid State Image Sensors, vol. 38, No. 5, pp. 1048–10551 (May 1991).

M. Tabei, et al., "A New CCD Architecture of High–Resolution and Sensitivity for Color Digital Still Picture," IEEE Transaction on Electron Devices, Special Issue on Solid State Image Sensors, vol. 38, No. 5, pp. 1052–1058 (May 1991).

J. Bosiers, et al., "A 2/3–in 1187(H) × 581(V) S–VHS–Compatible Frame–Transfer CCD for ESP and Movie Mode," IEEE Transaction on Electron Devices, Special Issue on Solid State Image Sensors, vol. 38, No. 5, pp. 1059–1068 (May 1991).

B. Burke, "An Abuttable CCD Imager for Visible and X–Ray Focal Plane Arrays," IEEE Transaction on Electron Devices, Special Issue on Solid State Image Sensors, vol. 38, No. 5, pp. 1069–1076 (May 1991).

E. Garcia, "CCD Arrays for Readout of Electrophotographic Latent Images," IEEE Transaction on Electron Devices, Special Issue on Solid State Image Sensors, vol. 38, No. 5, pp. 1077–1085 (May 1991).

T. Kaneko, et al., "400 dpi Integrated Contact Type Linear Image Sensors with Poly–Si TFT's Analog Readout Circuits and Dynamic Shift Registers," IEEE Transaction on Electron Devices, Special Issue on Solid State Image Sensors, vol. 38, No. 5, pp. 1086–1093 (May 1991).

C. K. Chen, et al., "Ultraviolet, Visible, and Infrared Response of PtSi Schottky–Barrier Detectors Operated in the Front–Illuminated Mode," IEEE Transaction on Electron Devices, Special Issue on Solid State Image Sensors, vol. 38, No. 5, pp. 1094–1103 (May 1991).

R. B. Bailey, et al., "256 × 256 Hybrid HgCdTe Infrared Focal Plane Arrays," IEEE Transaction on Electron Devices, Special Issue on Solid State Image Sensors, vol. 38, No. 5, pp. 1104–1109 (May 1991).

H. Zogg, et al., "Infrared Sensor Arrays with 3–12 $\mu$m Cutoff Wavelengths in Heteroepitaxial Narrow–Gap Semiconductor on Silicon Substrates," IEEE Transaction on Electron Devices, Special Issue on Solid State Image Sensors, vol. 38, No. 5, pp. 1110–1117 (May 1991).

C. G. Bethea, et al., "10–$\mu$m GaAs / AlGaAs Multiquantum Well Scanned Array Infrared Imaging Camera," IEEE Transaction on Electron Devices, Special Issue on Solid State Image Sensors, vol. 38, No. 5, pp. 1118–1123 (May 1991).

L. J. Kozlowski, et al., "LWIR 128 × 128 GaAs / AlGaAs Multiple Quantum Well Hybrid Focal Plane Array," IEEE Transaction on Electron Devices, Special Issue on Solid State Image Sensors, vol. 38, No. 5, pp. 1124–1130 (May 1991).

M. Denda, et al., "4–Band × 4096–Element Schottky–Barrier Infrared Linear Image Sensor," IEEE Transaction on Electron Devices, Special Issue on Solid State Image Sensors, vol. 38, No. 5, pp. 1131–1135 (May 1991).

S. Tohyama, et al., "A New Concept Silicon Homojunction Infrared Sensor," IEEE Transaction on Electron Devices, Special Issue on Solid State Image Sensors, vol. 38, No. 5, pp. 1136–1140 (May 1991).

T–L Lin, et al., "SiGe / Si Heterojunction Internal Photoemission Long–Wavelength Infrared Detectors Fabricated by Molecular Beam Epitaxy," IEEE Transaction on Electron Devices, Special Issue on Solid State Image Sensors, vol. 38, No. 5, pp. 1141–1144 (May 1991).

M. Okuyama, et al., "Room–Temperature–Operated Infrared Image CCD Sensor Using Pyroelectric Gate Coupled by Dielectric Connector," IEEE Transaction on Electron Devices, Special Issue on Solid State Image Sensors, vol. 38, No. 5, pp. 1145–1151 (May 1991).

J.G.C. Bakker, "Simple Analytical Expressions for the Fringing Field and Fringing–Field–Induced Transfer Time in Charge–Coupled Devices," IEEE Transaction on Electron Devices, Special Issue on Solid State Image Sensors, vol. 38, No. 5, pp. 1152–1161 (May 1991).

E. K. Banghart, et al., "A Model for Charge Transfer in Buried–Channel Charge–Couple Devices at Low Temperature," IEEE Transaction on Electron Devices, Special Issue on Solid State Image Sensors, vol. 38, No. 5, pp. 1162–1174 (May 1991).

C. R. Hoople, et al, "Characteristics of Submicrometer Gaps in Buried–Channel CCD Structures," IEEE Transaction on Electron Devices, Special Issue on Solid State Image Sensors, vol. 38, No. 5, pp. 1175–1181 (May 1991).

E.R. Fossum, et al., "Two–Dimesional Electron Gas Charge–Coupled Devices (2DEG–CCD's)," IEEE Transaction on Electron Devices, Special Issue on Solid State Image Sensors, vol. 38, No. 5, pp. 1182–1192 (May 1991).

J.G.C. Bakker, et al, "The Tacking CCD: A New CCD Concept," IEEE Transaction on Electron Devices, Special Issue on Solid State Image Sensors, vol. 38, No. 5, pp. 1193–1200 (May 1991).

S. Takayama, et al., "A Dynamic Model of an a–Si:H Photoconductive Sensor," IEEE Transaction on Electron Devices, Special Issue on Solid State Image Sensors, vol. 38, No. 5, pp. 1201–1205 (May 1991).

P. Centen, "CCD On–Chip Amplifiers: Noise Performance versus MOS Transistor Dimensions," IEEE Transaction on Electron Devices, Special Issue on Solid State Image Sensors, vol. 38, No. 5, pp. 1206–1216 (May 1991).

N. Ozawa, et al., "A Correlative Coefficient Multiplying (CCM) Method for Chrominance Moire Reduction in Single–Chip Color Video Cameras," IEEE Transaction on Electron Devices, Special Issue on Solid State Image Sensors, vol. 38, No. 5, pp. 1217–1225 (May 1991).

Y.T. Tsai, "Color Image Compression for Single–Chip Cameras," IEEE Transaction on Electron Devices, Special Issue on Solid State Image Sensors, vol. 38, No. 5, pp. 1226–1232 (May 1991).

P. Noble, "Self–Scanned Silicon Image Detector Arrays," IEEE Trans. on Electron Devices, vol. ED–15, No. 4, pp. 202–209 (Apr. 1968).

J. Nishizawa, et al., "Static Induction Transistor Image Sensors," IEEE Trans. on Electron Devices, vol. ED–26 (12), pp. 1970–1977 (Dec. 1979).

K. Matsumoto, et al., "A New MOS Phototransistor Operating in a Non–Destructive Readout Mode," Jpn. J. Appl. Phys., vol. 24, No. 5, pp. L323–L325 (1985).

H. Ando, et al., "Design Consideration and Performance of a New MOS Imaging Device," IEEE Trans. on Electron Devices, vol. ED–32, No. 8, pp. 1484–1489 (Aug. 1985).

T. Nakamura, et al., "A New MOS Image Sensor Operating in a Non–Destructive Readout Mode," IEDM Tech. Dig., pp. 353–356 (1986).

A. Yusa, et al., "SIT Image Sensor: Design Considerations and Characteristics" IEEE Trans. on Electron Devices, vol. ED–33, No. 6, pp. 735–742 (Jun. 1986).

N. Tanaka, et al., "A Novel Bipolar Imagine Device with Self–Noise–Reduction Capability," IEEE Trans. on Electron Devices, vol. 36(1), pp. 31–38 (Jan. 1989).

Z. Huang, et al., "A Novel Amplified Image Sensor with a–Si:H Photoconductor and MOS Transistor," IEEE Trans. on Electron Devices, vol. 37, No. 6, pp. 1432–1438 (Jun. 1990).

Y. Nakamura, et al., "Design of Bipolar Imaging Devices (BASIS): Analysis of Random Noise," IEEE Trans. on Electron Devices, vol. 39(6), pp. 1341–1349 (Jun. 1992).

E. Fossum, "Active–pixel sensors challenge CCDs," Laser Focus World, vol. 29, pp. 83–87 (Jun. 1993).

S. Mendis, et al., "A 128 × 128 CMOS Active Pixel Image Sensor for Highly Integrated Imaging Systems," Proc. of the 1993 IEEE International Electron Devices Meeting, pp. 583–586 (1993).

S. Mendis, et al., "Progress in CMOS Active Pixel Image Sensors," Proc. SPIE, vol. 2171, pp. 19–29 (1994).

S. Mendis, et al., "CMOS Active Pixel Image Sensor," IEEE Trans. on Electron Devices, vol. 41, No. 3, pp. 452–453 (Mar. 1994).

T. Kinugasa, et al., "An Electronic Variable–Shutter System in Video Camera Use," IEEE Transactions on Consumer Electronics, vol. CE–33, No. 3, pp. 249–255 (1987).

S. Mendis, et al., "CMOS Active Pixel Image Sensor," Citation Unknown, pp. 1–7 (Jul. 1993).

* cited by examiner

| Array Size | 256 x 256 |
| --- | --- |
| Pixel Size | 20.4 μm |
| Technology | 1.2 μm n-well CMOS (HP) |
| Maximum Clock Rate | 10 MHz |
| Minimum Clock Rate | none |
| Maximum Pixel Rate | 2.5 MHz |
| Maximum Integration Delay | $16 \times 10^9$ clock periods or 1600 secs at 10 MHz |

CMOS ACTIVE PIXEL SENSOR TYPE IMAGING SYSTEM ON A CHIP

This a divisional of U.S. application Ser. No. 09/120,856, filed Jul. 21 1998 pending which is a continuation of U.S. application Ser. No. 08/789,608, filed Jan 24, 1997 now U.S. Pat. No. 5,841,126 which is a continuation in-part of U.S. application Ser. No. 08/558,521, filed Nov. 16, 1995, now U.S. Pat. No. 6,101,232 which is a continuation of U.S. application Ser. No. 08/188,032, filed Jan 28, 1994, now U.S. Pat. No. 5,471,515.

ORIGIN

The invention described herein was made in performance of work under NASA contract and is subject to the provisions of Public Law 96-517 (35 USC 202) in which the contractor has elected to retain title.

FIELD OF THE INVENTION

The present invention relates to a single chip imaging sensor.

BACKGROUND AND SUMMARY OF THE INVENTION

Imaging technology is the science of converting an image to a signal indicative thereof. Imaging systems have broad applications in many fields, including commercial, consumer, industrial, medical, defense and scientific markets.

The original image sensors included an array of photosensitive elements in series with switching elements. Each photosensitive element received an image of a portion of the scene being imaged. That portion is called a picture element or pixel. The image obtaining elements produce an electrical signal indicative of the image plus a noise component. Various techniques have been used in the art to minimize the noise, to thereby produce an output signal that closely follows the image.

Size minimization is also important. The development of the solid state charge coupled device ("CCD") in the early 1970's led to more compact image systems. CCDs use a process of repeated lateral transfer of charge in an MOS electrode-based analog shift register. Photo-generated signal electrons are read after they are shifted into appropriate positions. However, the shifting process requires high fidelity and low loss. A specialized semiconductor fabrication process was used to obtain these characteristics.

CCDs are mostly capacitive devices and hence dissipate very little power. The major power dissipation in a CCD system is from the support electronics. One reason for this problem is because of the realities of forming a CCD system.

The specialized semiconductor fabrication process alluded to above is not generally CMOS compatible. Hence, the support circuitry for such a CCD has been formed using control electronics which were not generally CMOS compatible. The control electronics have dissipated an inordinate percentage of the power in such imaging devices. For example, CCD-based camcorder imaging systems typically operate for an hour on an 1800 mA-hr 6 V NiCad rechargeable battery, corresponding to 10.8 W of power consumption. Approximately 8 watts of this is dissipated in the imaging system. The rest is used by the tape recording system, display, and autofocus servos.

Space-based imaging systems often have similar problems. The space based systems operate at lower pixel rates, but with a lower degree of integration, and typically dissipate 20 watts or more.

The CCD has many characteristics which cause it to act like a chip-sized MOS capacitor. The large capacitance of the MOS device, for example, requires large clock swings, $\Delta V$, of the order of 5–15 V to achieve high charge transfer efficiency. The clock drive electronics dissipation is proportional to $C\Delta V^2 f$, and hence becomes large. In addition, the need for various COD clocking voltages (e.g. 7 or more different voltage levels) leads to numerous power supplies with their attendant inefficiencies in conversion.

Signal chain electronics that perform correlated double sampling ("CDS") for noise reduction and amplification, and especially analog to digital converters (ADC), also dissipate significant power.

The inventors also noted other inefficiencies in imaging systems. These inefficiencies included fill factor inefficiencies, fixed pattern noise, clock pick up, temporal noise and large pixel size.

Active pixel sensors, such as described in U.S. Pat. No. 5,471,515, the disclosure of which is incorporated by reference herein, use special techniques to integrate both the photodetector and the readout amplifier into the pixel area or adjacent the pixel area. This allows the signal indicative of the pixel to be read out directly. These techniques have enabled use of a logic family whose fabrication processes are compatible with CMOS. This has enabled the controlling circuitry to be made from CMOS or some other low power-dissipating logic family.

The inventors of the present invention have recognized techniques and special efficiencies that are obtained by specialized support electronics that are integrated onto the same substrate as the photosensitive element. Aspects of the present invention include integration, timing, control electronics, signal chain electronics, A/D conversion, and other important control systems integrated on the same substrate as the photosensitive element.

It is hence an object of the present invention to provide for the integration of an entire imaging system on a chip.

DESCRIPTION OF THE PREFERRED EMBODIMENTS

An active pixel sensor is herewith described with reference to FIGS. 1–4.

Figure 1:
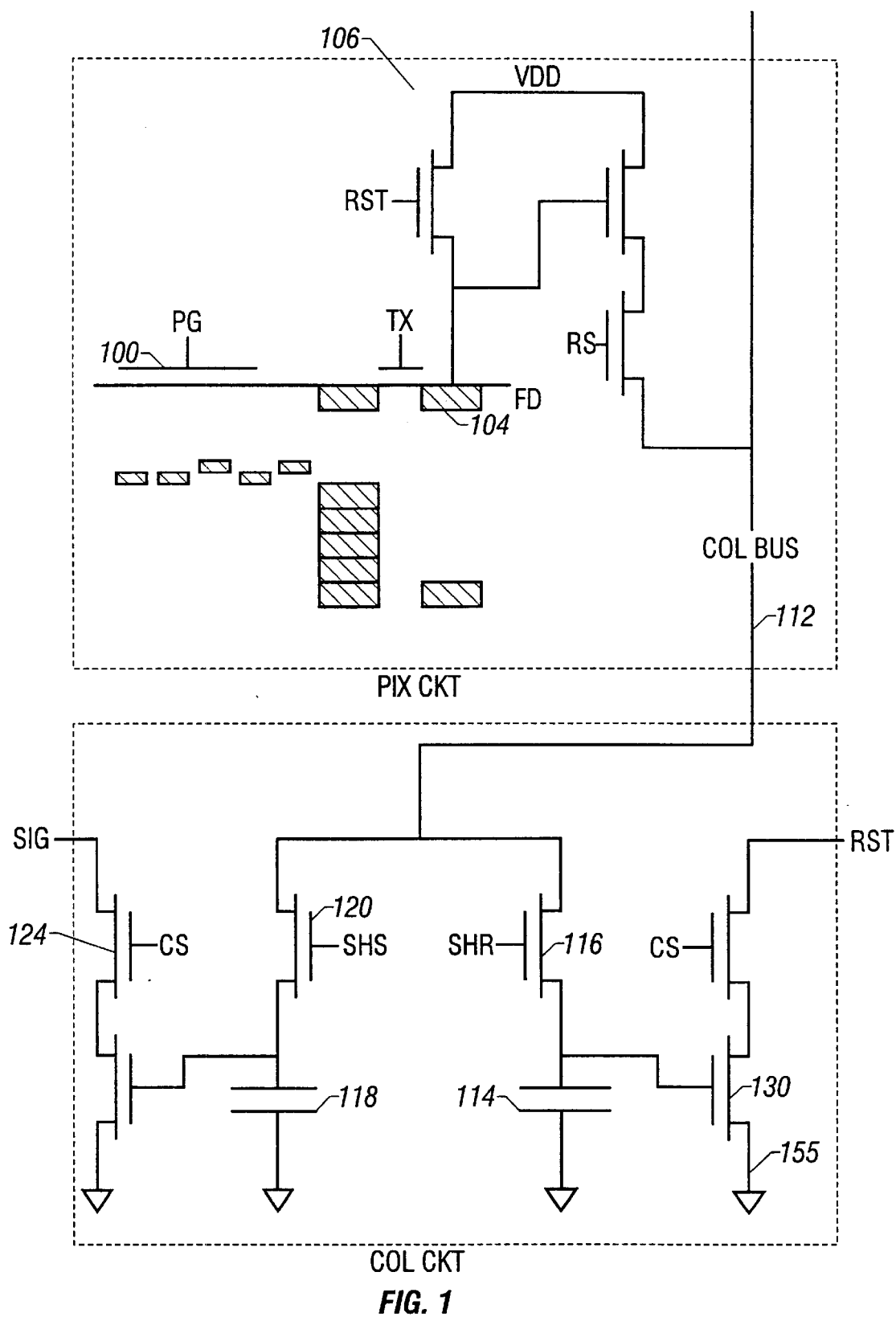
FIG. 1 shows a basic block diagram of a CMOS active pixel circuit.

A block diagram of a CMOS active pixel circuit is shown in FIG. 1. The device has a pixel circuit 150, and a column circuit 155.

Incident photons pass through the photogate ("PG") 100 in the pixel circuit 150 and generate electrons which are integrated and stored under PG 100. A number of the pixel circuits are arranged in each row of the circuit. One of the rows is selected for readout by enabling the row selection transistor 102 ("RS").

In the preferred embodiment, the floating diffusion output node 104 ("FD") is first reset by pulsing reset transistor ("RST") 106. The resultant voltage on FD 104 is read out from the pixel circuitry onto the column bus 112 using the source follower 110 within the pixel. The voltage on the column bus 112 is sampled onto a first holding capacitor 114 by pulsing transistor SHR 116. This initial charge is used as the baseline.

The signal charge is then transferred to FD 104 by pulsing PG 100 low. The voltage on FD 104 drops in proportion to the number of photoelectrons and the capacitance of FD. The new voltage on the column bus 112 is sampled onto a second capacitor 118 by pulsing SHR 120. The difference between the voltages on first capacitor 114 and second capacitor 118 is therefore indicative of the number of photoelectrons that were allowed to enter the floating diffusion.

The capacitors 114, 118 are preferably 1–4 pf capacitors.

All pixels on a selected row are processed simultaneously and sampled onto capacitor at the bottom of their respective columns. The column-parallel sampling process typically takes 1–10 $\mu$sec, and preferably occurs during the so-called horizontal blanking interval of a video image.

Each column is successively selected for read-out by turning on column selection p-channel transistors ("CS") 130. The p-channel source-followers 122, 124 in the column respectively drive the signal (SIG) and horizontal reset (RST) bus lines. These lines are loaded by p-channel load transistors which can be sent directly to a pad for off-chip drive, or can be buffered.

Noise in the sensor is preferably suppressed by the above-described correlated double sampling ("CDS") between the pixel output just after reset, before and after signal charge transfer to FD as described above. The CDS suppresses kTC noise from pixel reset, suppresses 1/f noise from the in-pixel source follower, and suppresses fixed pattern noise (FPN) originating from pixel-to-pixel variation in source follower threshold voltage.

The inventors found, however, that kTC noise may be reintroduced by sampling the signal onto the capacitors 114, 118 at the bottom of the column. Typical output noise measured in CMOS APS arrays is of the order of 140–170$\mu$ V/e-, corresponding to noise of the order of 13–25 electrons r.m.s. This is similar to noise obtained in most commercial CCDs, through scientific CCDs have been reported with read noise in the 3–5 electrons rms.

Typical biasing for each column's source-follower is 10 $\mu$A. This permits charging of the sampling capacitors in the allotted time. The source-followers can then be turned off by cutting the voltage on each load transistor.

The sampling average power dissipation $P_s$ corresponds to:

$$P_s = n\, I\, V\, d$$

where n is number of columns, I is the load transistor bias, V is the supply voltage, and d is the duty cycle. Using n=512, I=$\mu$A, V=5V and d=10%, a value for Ps of 2.5 mW is obtained.

A load current of 1 mA or more is needed to drive the horizontal bus lines at the video scan rate. The power dissipated is typically 5 mW.

Figure 2:
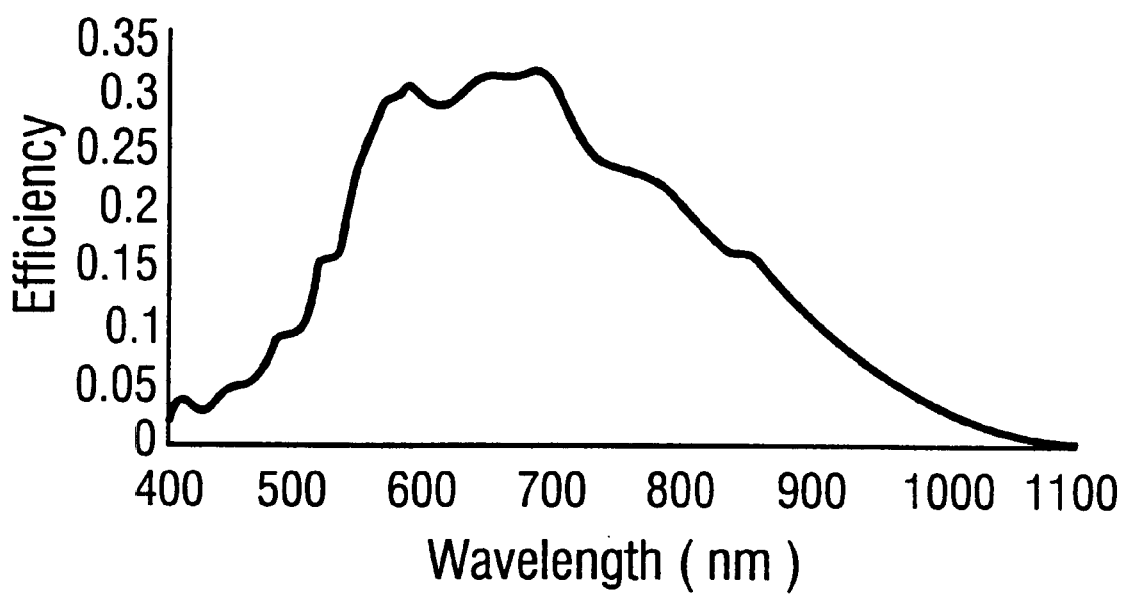
FIG. 2 shows a graph of typical APS cuantum efficiency.

Quantum efficiency measured in this CMOS APS array is similar to that for interline CCDs. A typical response curve is shown in FIG. 2. The inventors noticed from this that the quantum efficiency reflects significant responsivity in the "dead" part of the pixel; the part containing the readout circuitry rather than the photogate collector. The responsiveness was measured by intra-pixel laser spot scanning.

The inventors postulate the following reason. The transistor gate and channel absorb photons with short absorption lengths (i.e. blue/green). However, longer wavelength photons penetrate through these regions. The subsequently-generated carriers diffuse laterally and are subsequently collected by the photogate.

Thus, despite a fill factor of 25%–30%, the CMOS APS achieves quantum efficiencies that peak between 30%–35% in the red and near infrared. Microlenses are preferably added to refract photoelectrons from the dead part to a live part and hence improve quantum efficiency.

Figure 3:
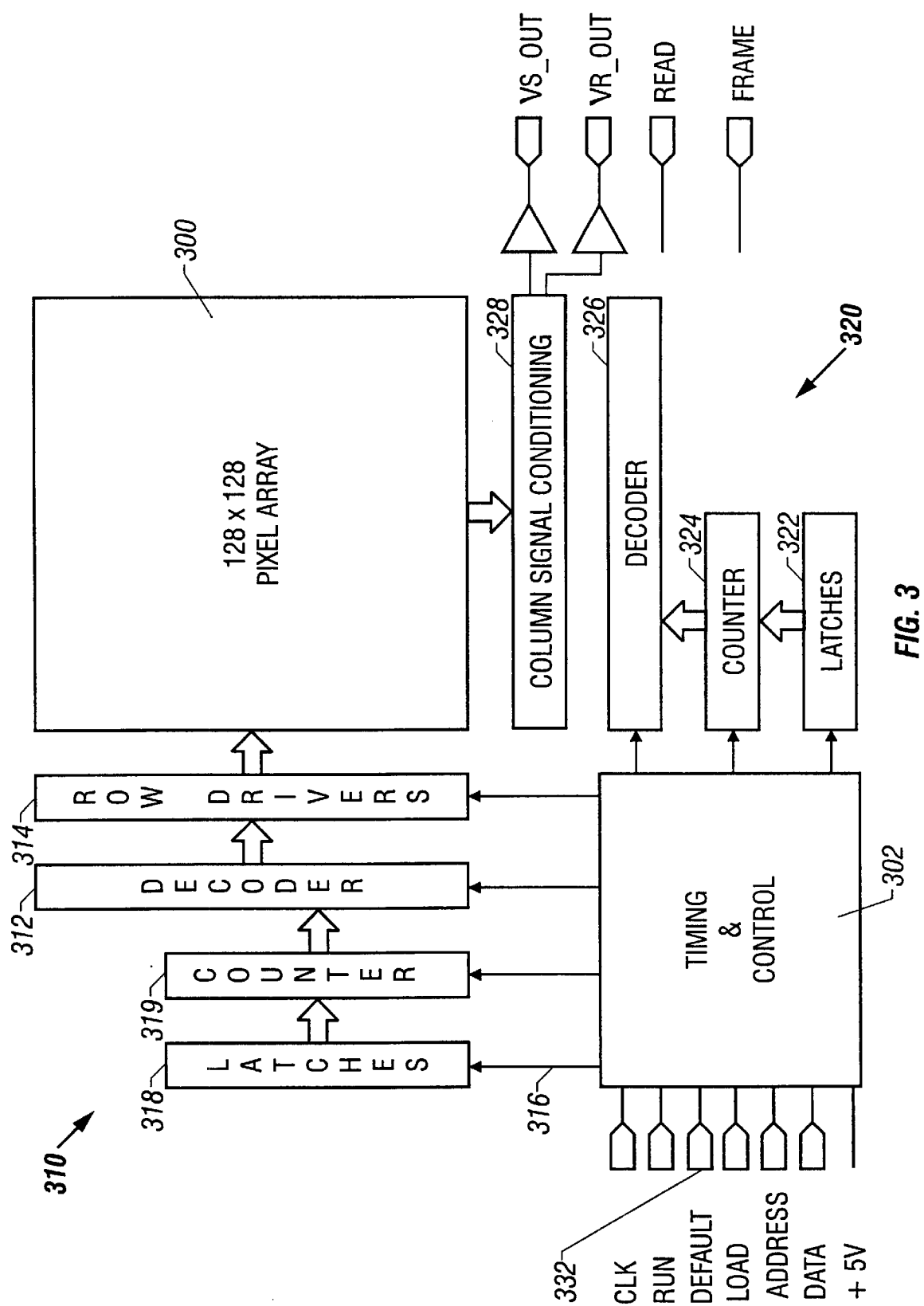
FIG. 3 shows the block diagram of the overall chip including drivers and controlling structures.

An important feature of the system described herein is the integration of on-chip timing and control circuits within the same substrate that houses the pixel array and the signal chain electronics. A block diagram of the chip architecture is shown in FIG. 3.

The analog outputs VS_out (signal) and VR_out (reset) are as described above. The digital outputs include FRAME and READ. Most of the inputs to the chip are asynchronous digital signals, as described herein.

The chip includes a pixel array 300, which is driven by on-chip electronics. Timing and control circuit 302 drives row electronics 310, and column electronics 320.

The control circuits can command read-out of any area of interest within the array. Row decoder 312 controls row drivers 314 which can select a certain row for readout. A specific row is selected by entry of a row value 316 which is output from timing and control 302. Row value 316 is stored in latch 318 which drives counter 319. Counter 319 can allow selection of subsequent rows that follow the current row. Similarly, columns can be selected and accessed by latches 322, counter 324, decoder 326 and column signal conditioning 328.

Each of the decoder counters can be preset to start and stop at any value that has been loaded into the chip via the 8-bit data bus 330. Therefore, as described above, selection of a row commands pixels in that row to be transferred to the appropriate row decoding elements, e.g., capacitors. Preferably there is one capacitor associated with each column. This provides for the sequential readout of rows using the column. The capacitors are preferably included within the column signal conditioner 328. Column decoders 326 also allow selection of only a certain column to be read. There are two parts of each column selection: where to start reading, and where to stop reading. Preferably the operation is carried out using counters and registers. A binary up-counter within the decoder 326 is preset to the start value. A preset number of rows is used by loading the 2's compliment. The up counter then counts up until an overflow.

An alternate loading command is provided using the DEFAULT LOAD input line 332. Activation of this line forces all counters to a readout window of 128×128.

A programmable integration time is set by adjusting the delay between the end of one frame and the beginning of the next. This parameter is set by loading a 32-bit latch via the input data bus 330. A 32-bit counter operates from one-fourth the clock input frequency and is preset at each frame from the latch. The counter can hence provide vary large integration delays. The input clock can be any frequency up to about 10 MHZ. The pixel readout rate is tied to one-fourth the clock rate. Thus, frame rate is determined by the clock frequency, the window settings, and the delay integration time. The integration time is therefore equal to the delay time and the readout time for a 2.5 MHZ clock. The maximum delay time is $2^{32}/2.5$ MHz, or around 28 minutes. These values therefore easily allow obtaining a 30 Hz frame.

Figure 4A:
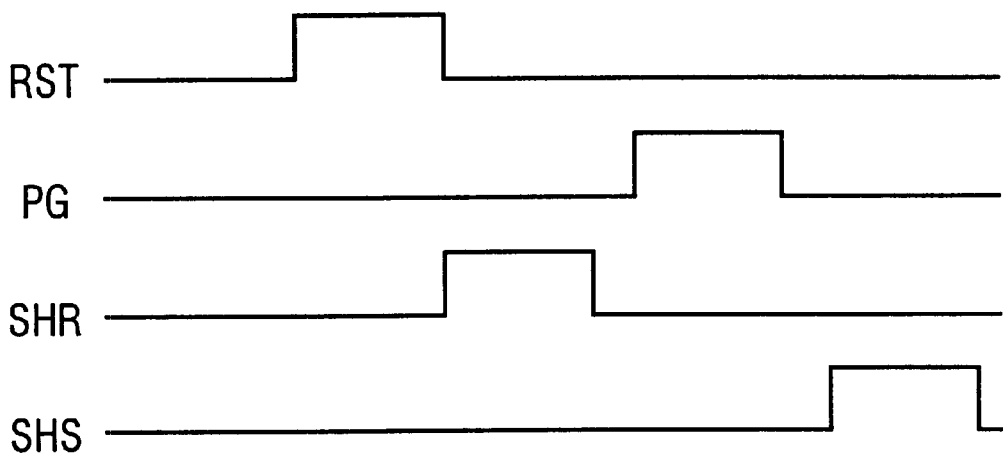
FIGS. 4A and 4B show the timing diagrams for photogate operation and photodiode operation, respectively.
Figure 4B:
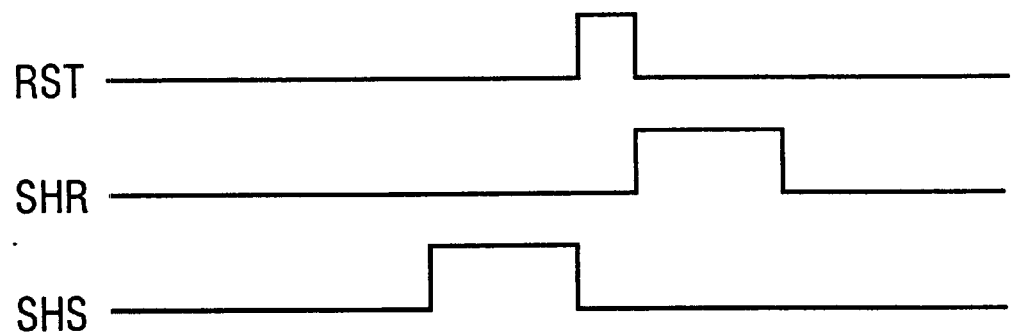

The timing and control circuit controls the phase generation to generate the sequences for accessing the rows. The sequences must occur in a specified order. However, different sequences are used for different modes of operation. The system is selectable between the photodiode mode of operation and the photogate mode of operation. The timing diagrams for the two gates are respectively shown in FIGS. 4a and 4b. FIG. 4a shows an operation to operate in the photogate mode and FIG. 4b shows operating in the photodiode mode. These different timing diagrams show that different column operations are possible. Conceptually this is done as follows. Column fixed pattern noise is based on differences in source follower thresholds between the different transistors. For example, if the base bias on a transistor is V1, the output is V1 plus the threshold.

The column signal conditioning circuitry contains a double-delta sampling fixed pattern noise ("FPN") suppression stage that reduces FPN to below 0.2% sat with a random distribution. Since the APS is formed of a logic family that is compatible with CMOS, e.g., NMOS, the circuitry can be formed of CMOS. This allows power dissipation in the timing and control digital circuitry to be minimized and to scale with clock rate.

An active pixel sensor includes both a photodetector and the readout amplifier integrated within the same substrate as the light collecting device, e.g., the photodiode. The readout amplifier is preferably within and/or associated with a pixel.

Figure 5A:
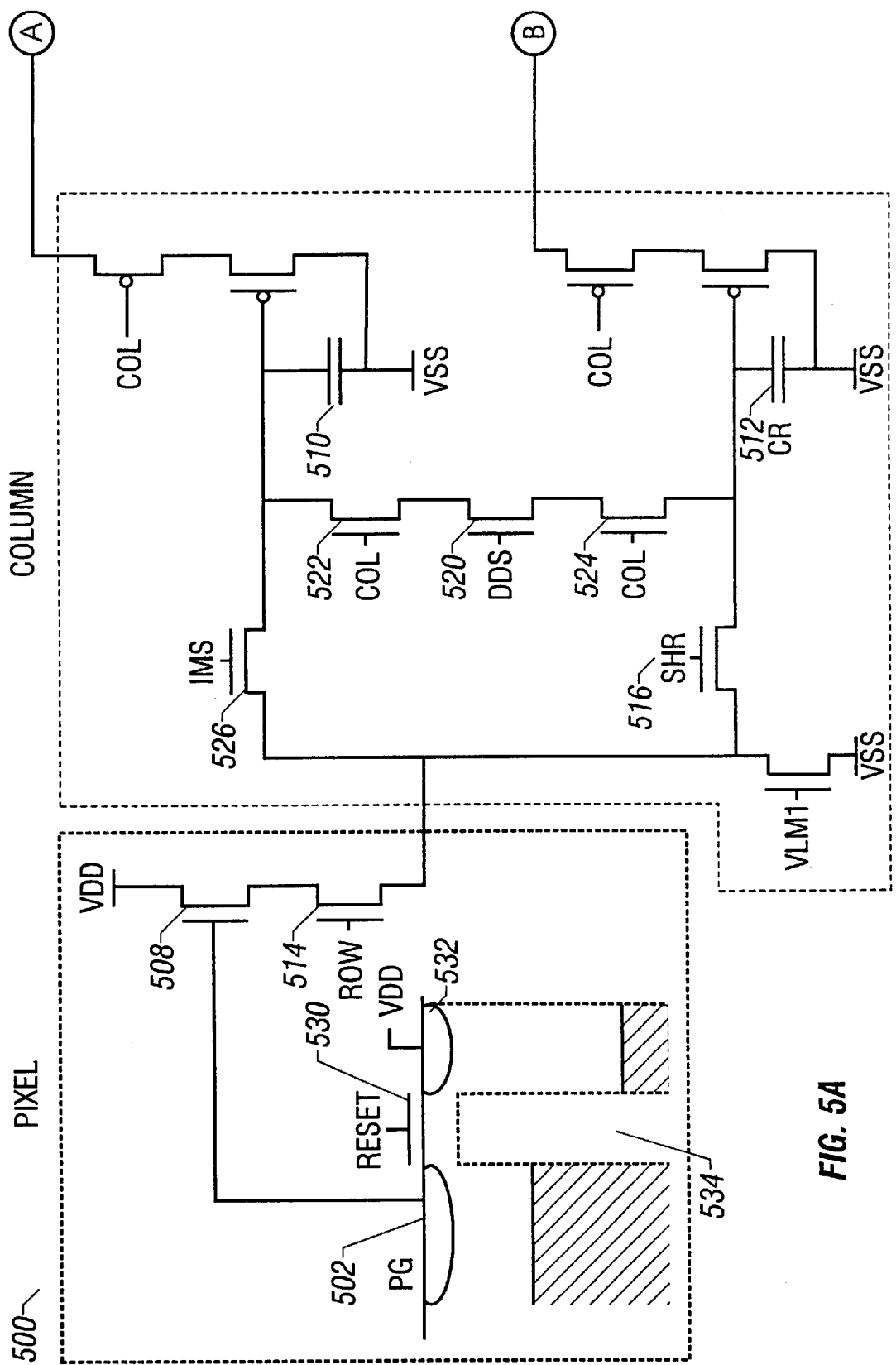
FIG. 5 shows a schematic of the active pixel sensor unit cell and readout circuitry.
Figure 5B:
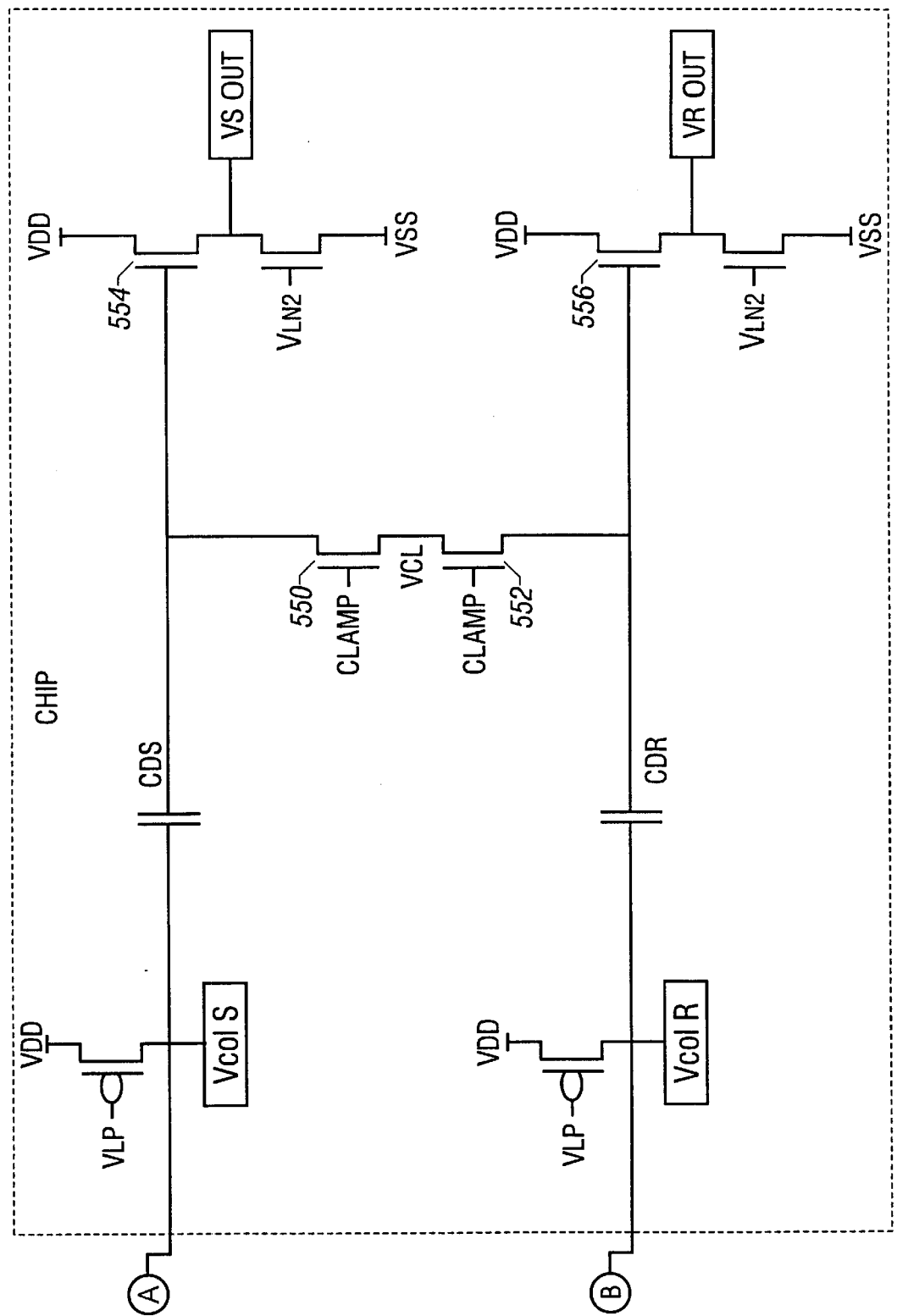

A first embodiment of the present invention is a 128×128 CMOS photodiode type active pixel sensor that includes on chip timing, control and signal train electronics. A more detailed drawing of the chip is shown in FIG. 5. Asynchronous digital signals are converted by this chip to VS and VR analog outputs which are used to run the chip.

Pixel portion 500 includes a photodiode 502 which stores incident photons under photogate 504. The photons are integrated as electrons within the photogate well. The output is buffered by follower 508.

The rows are arranged into an array. A particular row is selected by the row transistor 514. This allows the information from within the selected pixel 500 to be passed to the column decoder circuitry. Reset transistor 530 is connected to a sink 532. Reset transistor is biased to a low potential level to allow all charge to bleed to sink 532, and hence hold the stored charge in reset. The system is removed from reset by biasing the gate to a level as shown. This level is less than a highest possible potential to thereby allow charge which accumulates above that level to pass to sink 532. Hence, the charge cannot overflow in an undesired way. This suppresses the blooming effect.

Figure 6:
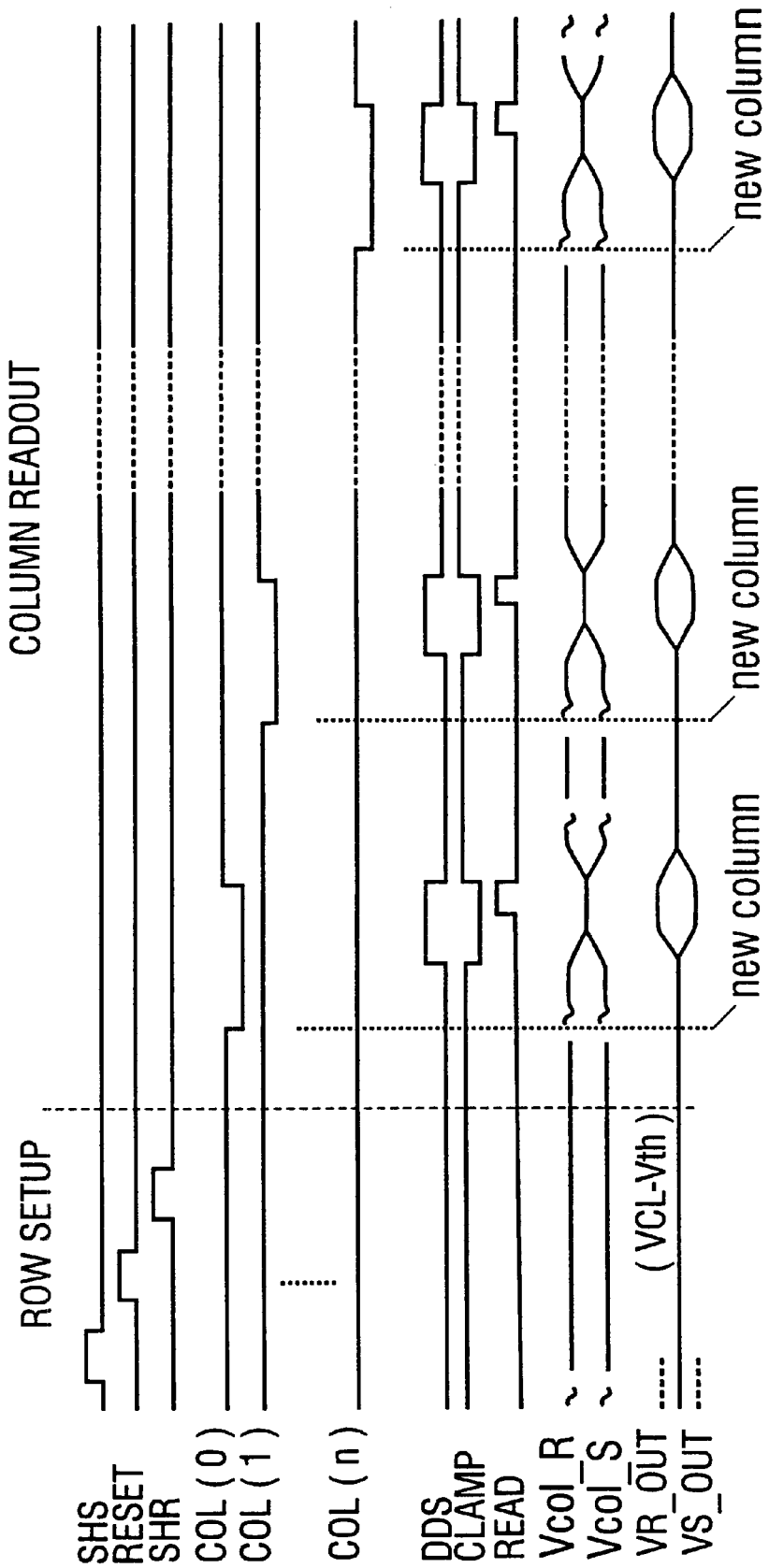
FIG. 6 shows a timing diagram for setup and readout.

The depicted photogate system is driven according to the readout sequence shown in FIG. 6. A row is selected by activating row selecting transistor 514. The cycle begins by sampling the signal present on each column pixel in that row. Sampling is initiated by biasing transistor 526 to place the signal from each column pixel in the row onto the holding capacitor 510.

After the current pixel value has been transferred to the capacitor 510, the pixel in the row is reset by biasing reset transistor to a low level, to photodiode 502 to the preset voltage sink 532.

Correlated double sampling is effected by sampling the reset value, as a reset level, onto the holding capacitor 512. This is done by activating the reset transistor 516.

The voltage value of the reset branch of the column circuit is given by $$Vcol\_R \cong \beta\{\alpha[V_{pdr}-V_{tpix}]-V_{tcolr}\}$$

Where $\alpha$ is the gain of the pixel source follower 508, $\beta$ is the gain of the column source follower 526, and $V_{pdr}$ is the voltage on the photodiode after reset, $V_{tpix}$ is the threshold voltage of the pixel source follower and channel transistor, and $V_{tcolr}$ is the threshold voltage of the column source follower p-channel transistor.

Using similar reasoning, the output voltage of the signal branch of the column circuit is $$Vcol\_S \cong \beta\{\alpha[V_{pds}-V_{tpix}]-V_{tcols}\}$$

where $V_{pds}$ is the voltage on the photodiode with the signal charge present and $V_{tcols}$ is the threshold voltage of the column source-follower p-channel transistor.

The inventors have found experimentally that the peak-to-peak variation $V_{tcolr}-V_{tcols}$ is typically between 10 and 20 millivolts. This, however, is a source of column to column fixed pattern noise. The inventors herein suggest a double delta sampling technique to eliminate this column to column noise. The present approach represents an improved version of the previously-described double delta sampling circuitry. The operation proceeds as follows. A column is first selected. After a settling time equivalent to half of the column selection period, a special double delta sampling technique is performed to remove the column fixed pattern noise. Therefore, the varying thresholds on the different transistors cause varying outputs. According to this aspect, the threshold outputs of these transistors are equalized using a capacitor to equalize the charge. The capacitor is applied with the charge before and after the voltage change. Therefore, the output of the capacitor represents the difference between before and after, and the fixed pattern noise component drops out of the equation.

This system uses a DDS switch 520 and first and second column select switches 522, 524 to short across the respective capacitors. All three switches are turned on to short across the two sample and hold capacitors 510. This clamp operation is shown in line 8 of FIG. 6.

Prior to the DDS operation, the reset and signal column components, Vcol_R and Vcol_S include their signal values plus a source follower voltage threshold component from the appropriate source follower. The object of the special following circuit of the present invention is to remove that source follower threshold component. The operation proceeds as follows. Prior to the beginning of some operation, the capacitors are precharged through clamp transistors to a clamp voltage $V_{cl}$. This is maintained by turning on clamp transistors 550 and 552 to connect the appropriate capacitors to the voltage $V_{cl}$. The clamp operation is shown on line 8 of FIG. 6. Immediately after the clamp is released, the DDS transistors 520, 522 and 524 are turned on. This has the effect of shorting across the capacitors 510 and 512. When the transistors are shorted, the voltage that is applied to the output drivers 554, 556 includes only the voltage threshold component. The differential amplification of the voltage render the output voltage free of the voltage threshold component. Mathematically, prior to clamp being deactivated, the output signals are:

$$VR\_OUT \cong \gamma(V_{cl}-V_{tr})$$

and $$VS\_OUT \cong \gamma(V_{cl}-V_{ts})$$

where $\gamma$ is the gain of the third stage source-follower, $V_{cl}$ is the clamp voltage, and $V_{tr}$ and $V_{ts}$ are the threshold voltages of the third stage source-follower n-channel transistors, reset and signal branch respectively. Deactivation of the clamp circuit and simultaneous activation of the DDS switch causes several changes. The voltages in the two column branch sampling circuits equalize becoming:

$$V_{c3}=V_{cr}=\alpha[V_{pdr}-V_{tpix}+V_{pds}-V_{tpix}]/2$$

This in turn causes a change in Vcol_S and Vcol_R to:

$$Vcol\_R'\cong\beta\{\alpha[V_{pdr}-V_{tpix}+V_{pds}-V_{tpix}]/2-V_{tcolr}\}$$

and $$Vcol\_S'\cong\beta\{\alpha[V_{pdr}-V_{tpix}+V_{pds}-V_{tpix}]/2-V_{tcols}\}$$

Consequently, the voltage outputs change to:

$$VR\_OUT\cong\gamma(V_{cr}-Vcol\_R'-Vcol\_R-V_{tr})$$

and $$VS\_OUT\cong\gamma(V_{cr}-Vcol\_S'-Vcol\_S-V_{ts})$$

We note $$Vcol\_S'-Vcol\_S=\beta\{\alpha[V_{pds}-V_{pdr}]/2\}$$

and $$Vcol\_R'-Vcol\_R=\beta\{\alpha[V_{pdr}-V_{pds}]/2\}$$

When the outputs are differentially amplified off-chip, the common clamp voltage Vcl is removed, leaving only the difference between signal and reset. The net differential output voltage is given by:

$$VR\_OUT-VS\_OUT=\alpha\beta\gamma(V_{pdr}-V_{pds}=V_{const})$$

Figure 7:
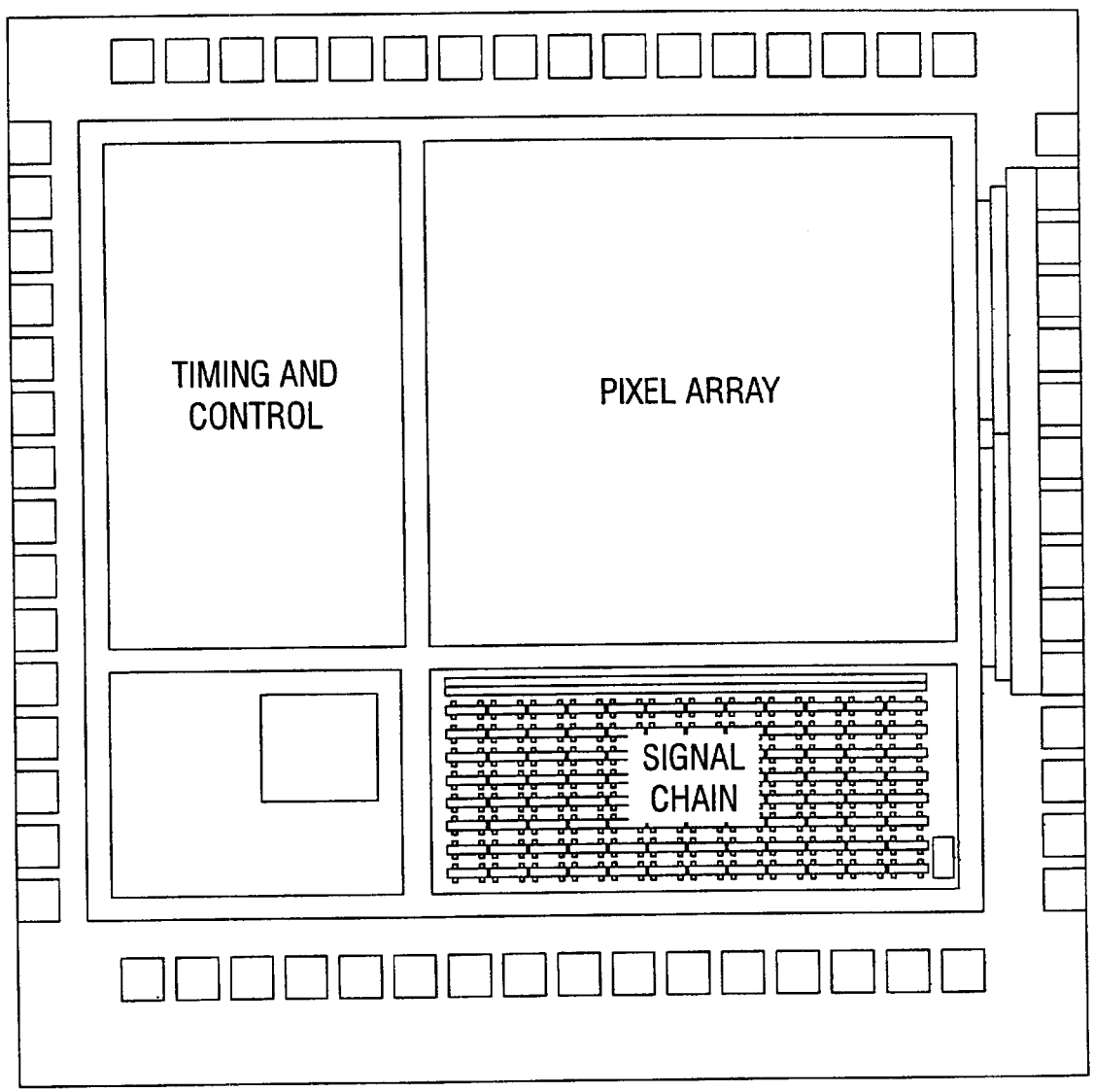
FIG. 7 shows a drawing of an actual layout of the pixel and control circuitry.

FIG. 7 shows the layout-of the pixel for 128×128 array size device. This system formed a 19.2 micron pixel size using 1.2 µm n-well CMOS. The maximum clock rate is 10 MHZ, the maximum pixel rate is 2.5 MHZ and maximum integration delay is $1.6\times10^9$ clock periods.

A second embodiment uses similar design techniques to produce a 256×256 array size. This embodiment also uses a pixel with a photogate imaging element along with four transistors to perform the functions of readout, selection, and reset. Readout is preferably achieved using a column parallel architecture which is multiplexed one row at a time and then one column at a time through an on-chip amplifier/buffer. An important part of this embodiment, like the first embodiment, is the use of a chip common logic elements to control row and address decoders and delay counters.

This embodiment allows use in three modes of operation: Photogate mode, photodiode mode and differencing mode. The photogate mode is the standard mode for this chip. The photodiode mode alters the readout timing to be similar to that for photodiode operation. The differencing mode alters the readout timing in such a way that the value of each pixel output is the difference between the current frame and the previous frame. The chip inputs that are required are a single +5 V power supply, start command, and parallel data load commands for defining integration time and windowing parameters. The output has two differential analog channels.

Figure 8:
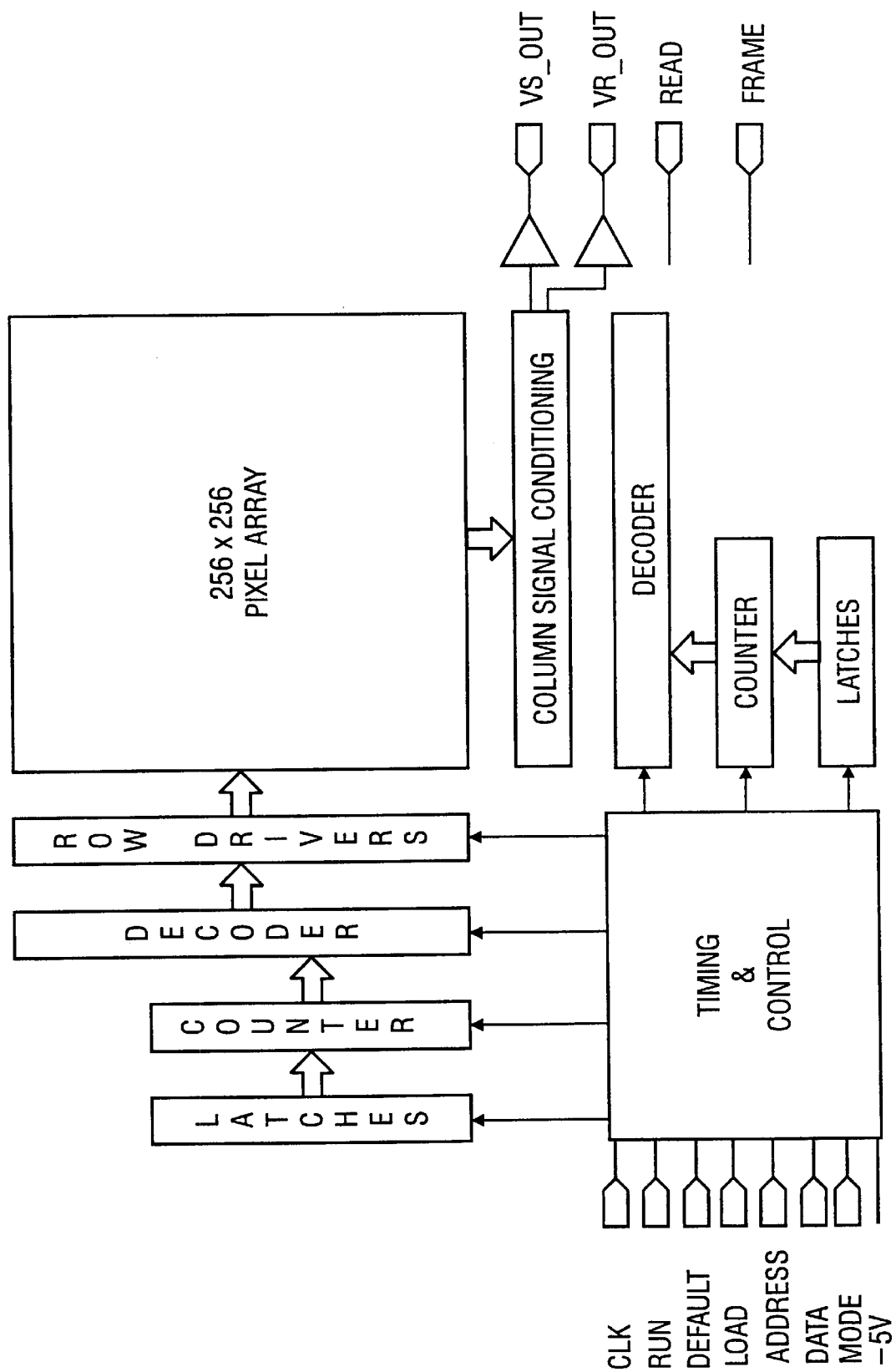
FIG. 8 shows a block diagram of a CMOS APS chip.

The second embodiment uses the block diagram of the chip architecture shown in FIG. 8. The analog outputs of VS_OUT (signal) and VR_OUT (reset), and digital outputs of FRAME and READ. The inputs to the chip are asynchronous digital signals. The chip includes addressing circuitry allowing readout of any area of interest within the 256×256 array. The decoder includes counters that are preset to start and stop at any value that has been loaded into the chip via the 8-bit data bus. An alternate loading command is provided using the DEFAULT input line. Activation of this line forces all counters to a readout window of 256×256.

A programmable integration time is set by adjusting the delay between the end of one frame and the beginning of the next. This parameter is set by loading a 32-bit latch via the input data bus. A 32-bit counter operates from one-fourth the clock input frequency and is preset at each frame from the latch. This counter allows forming very large integration delays. The input clock can be any frequency up to about 10 MHZ. The pixel readout rate is tied to one fourth the clock rate. Thus, frame rate is determined by the clock frequency, the window settings, and the delay integration time. A 30 HZ frame rate can be achieved without difficulty.

The chip is idle when the RUN command is deactivated. This is the recommended time for setting the operating parameters. However, these parameters can be set at any time because of the asynchronous nature of operation. When RUN is activated, the chip begins continuous readout of frames based on the parameters loaded in the control registers. When RUN is deactivated, the frame in progress runs to completion and then stops.

The 256×256 CMOS APS uses a system having a similar block diagram to those described previously. The pixel unit cell has a photogate (PG), a source-follower input transistor, a row selection transistor and a reset transistor. A load transistor VLN and two output branches to store the reset and signal levels are located at the bottom of each column of pixels. Each branch has a sample and hold capacitor (CS or CR) with a sampling switch (SHS or SHR) and a source-follower with a column-selection switch (COL). The reset and signal levels are read out differentially, allowing correlated double sampling to suppress 1/f noise and fixed pattern noise (not kTC noise) from the pixel.

A double delta sampling (DDS) circuit shorts the sampled signals during the readout cycle reducing column fixed pattern noise. These readout circuits are common to an entire column of pixels. The load transistors of the second set of source followers (VLP) and the subsequent clamp circuits and output source followers are common to the entire array. After a row has been selected, each pixel is reset (RESET) and the reset value is sampled (SHR) onto the holding capacitor CR. Next, the charge under each photogate in the row is transferred to the floating diffusion (FD). This is followed by sampling this level (SHS) onto holding capacitor CS. These signals are then placed on the output data bus by the column select circuitry. In the Photodiode mode this process, is reversed; first the charge under the photogate is read out and then the reset level is sampled. This non-correlated double sampling mode would be primarily used with a photodiode, i.e., non active pixel sensor, pixel.

In the differencing mode, the capacitors CS and CR are used to store the signal from the previous frame and the current frame. This is achieved by altering the timing in the following way: Rather than starting with a reset operation, the signal on the floating diffusion is read out to one of the sample and hold capacitors. This represents the previous pixel value. The reset is then performed followed by a normal read operation. This value is then stored on the other sample and hold capacitor. The difference between these two signals is now the frame to frame difference.

A simplified expression for the output of the reset branch of the column circuit is given by:

$$Vcol\_R \cong \beta\{\alpha[Vr-V_{tpix}]-V_{tcolr}\}$$

where $\alpha$ is the gain of the pixel source-follower; $\beta$ is the gain of the column source-follower, Vr is the voltage on the floating diffusion after reset, $V_{tpix}$ is the threshold voltage of the pixel source-follower n-channel transistor, and $V_{tcolr}$ is the threshold voltage of the column source-follower p-channel transistor. Similarly, the output voltage of the signal branch of the column circuit is given by:

$$Vcol\_S \cong \beta\{\alpha[V_s-V_{tpix}]-V_{tcols}\}$$

where $V_S$ is the voltage on the floating diffusion wish the signal charge present and $V_{tcols}$ is the threshold voltage of the column source-follower p-channel transistor. Experimentally, the peak to peak variation in $V_{tcolr}-V_{tcols}$ is typically 10–20 mV. It is desirable to remove this source of column-to-column fixed pattern noise FPN. JPL has previously developed a double delta sampling (DDS) technique to eliminate the column-to-column FPN. This approach represented an improved version of the DDS circuitry.

Sequential readout of each column is as follows. First a column is selected. After a settling time equivalent to one-half the column selection period, the DDS is performed to remove column fixed pattern noise. In this operation, a DDS switch and two column selection switches on either side are used to short the two sample and hold capacitors CS and CR. Prior to the DDS operation the reset and signal outputs (Vcol_R and VCOL_S) contain their respective signal values plus a source follower voltage threshold component. The DDS switch is activated immediately after CLAMP is turned off. The result is a difference voltage coupled to the output drivers (VR_OUT and VS_OUT) that is free of the voltage threshold component.

Figure 9:
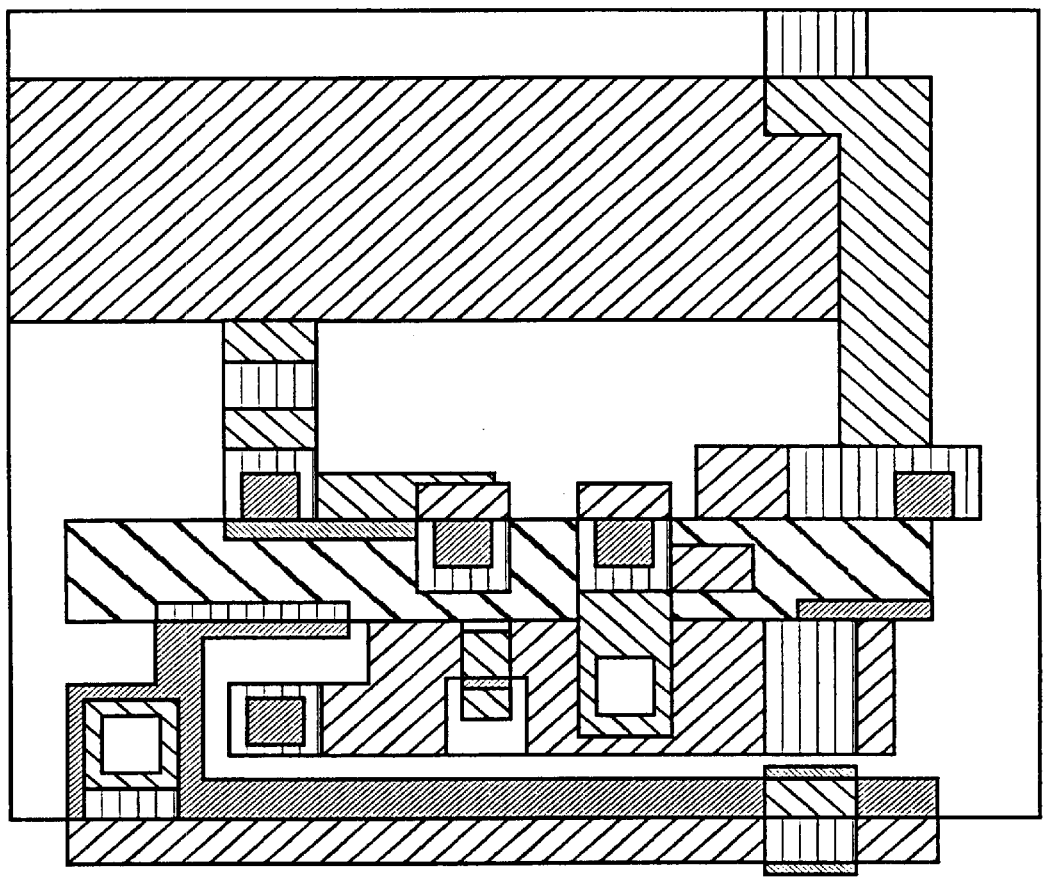
FIG. 9 shows an exemplary pixel layout.

This chip uses a similar pixel cell to that shown in FIG. 5. FIG. 9 shows the layout of the pixel cell. PG and RESET are routed horizontally in polysilicon while the pixel output is routed vertically in metal1. Metal2 was routed within the pixel for row selection. Metal2 was also used as a light shield and covers most of the active area outside of the pixel array. The designed fill factor of the pixel is approximately 21%.

According to another feature, a logo can be formed on the acquired image by using a light blocking metal light shield. The light shield is formed to cover certain pixels in the shape of the logo to be applied. This blocks out those underlying pixels in the array, thereby forming a logo in the shape of the blocked pixels.

The output saturation level of the sensor is 800 mv when operated from a 5 V supply. Saturation is determined by the difference between the reset level on the floating diffusion node (e.g. 3 V) and the minimum voltage allowed on the pixel source follower gate (e.g. threshold voltage of approx. 0.8 volts). This corresponds to a full well of approximately 75,000 electrons. This can be increased by operating at a larger supply voltage, gaining about 47,000 per supply volt.

Dark current was measured at less than 500 pA/cm$^2$.

Conversion gain ($\mu$V/e−) was obtained per pixel by plotting the variance in pixel output as a function of mean signal for flat field exposure. The fixed pattern noise arising from dispersion in conversion gain was under 1%—similar to the value found in CCDs and consistent with the well-controlled gain of a source-follower buffer.

The quantum efficiency of the detector was measured using a CVI ¼ m monochromator and a tungsten/halogen light source, calibrated using a photodiode traceable to NIST standards.

What is claimed is:

1. A single chip camera device, comprising:
   a substrate, having integrated thereon an image acquisition portion and a control portion, both of which are formed using a logic family that is compatible with CMOS;
   said image acquisition portion integrated in said substrate including an array of photoreceptors;
   said control portion integrated in said substrate including a signal controlling device, controlling said photoreceptors to output their signals,
   said control portion also including, integrated in said substrate, a timing circuit integrated within the same substrate that houses the array of photoreceptors, controlling a timing of operation of said array of photoreceptors; and
   a circuit, integrated on said substrate, which reduces a fixed pattern noise, wherein said signal controlling device includes a column-parallel read out device, which reads out a row of said photoreceptors at substantially the same time.

2. A camera device as in claim 1, wherein said array of photoreceptors includes an active pixel sensor, where each element of the array includes both a photoreceptor and a readout amplifier integrated within the same substrate as the photoreceptor.

3. A camera device as in claim 2, wherein said readout amplifier is preferably within and/or associated with one element of the array.

4. A camera device as in claim 2, wherein said photoreceptors are photodiodes.

5. A camera device as in claim 2 wherein said photoreceptors are photogates.

6. A single chip camera device, comprising:
   a substrate, having integrated thereon an image acquisition portion and a control portion, both of which are formed using a logic family that is compatible with CMOS;
   said image acquisition portion integrated in said substrate including an array of photoreceptors;
   said control portion integrated in said substrate including a signal controlling device, controlling said photoreceptors to output their signals,
   said control portion also including, integrated in said substrate, a timing circuit integrated within the same substrate that houses the array of photoreceptors, controlling a timing of operation of said array of photoreceptors;
   a circuit, integrated on said substrate, which reduces a fixed pattern noise; and
   a mode selector device, selecting a mode of operation of said chip, wherein said photoreceptors are either photogates or photodiodes, and said mode selector device selects a first mode of operation for operation with photogates, and a second mode of operation, different than said first mode of operation, for operation with photodiodes.

7. A single chip camera device, comprising:
   a substrate, having integrated thereon an image acquisition portion and a control portion, both of which are formed using a logic family that is compatible with CMOS;
   said image acquisition portion integrated in said substrate including an array of photoreceptors;
   said control portion integrated in said substrate including a signal controlling device, controlling said photoreceptors to output their signals, said control portion also including, integrated in said substrate, a timing circuit integrated within the same substrate that houses the array of photoreceptors, controlling a timing of operation of said array of photoreceptors; and a circuit, integrated on said substrate, which reduces a fixed pattern noise, wherein said timing circuit controls readout from said chip in a correlated double sampling mode.

8. A camera device as in claim 6, further comprising a differencing mode which alters readout timing in such a way that the value of each pixel output represents a difference between a current frame and a previous frame.

9. A single chip camera device, comprising:

a substrate, having integrated thereon an image acquisition portion and a control portion, both of which are formed using a logic family that is compatible with CMOS;

said image acquisition portion integrated in said substrate including an array of photoreceptors;

said control portion integrated in said substrate including a signal controlling device, controlling said photoreceptors to output their signals, said control portion also including, integrated in said substrate, a timing circuit integrated within the same substrate that houses the array of photoreceptors, controlling a timing of operation of said array of photoreceptors; and a circuit, integrated on said substrate, which reduces a fixed pattern noise including at least one charge storage device, sampling a level indicative of reset.

10. A single chip camera device, comprising:

a substrate, having integrated thereon an image acquisition portion and a control portion, both of which are formed using a logic family that is compatible with CMOS;

said image acquisition portion integrated in said substrate including an array of photoreceptors;

said control portion integrated in said substrate including a signal controlling device, controlling said photoreceptors to output their signals, said control portion also including, integrated in said substrate, a timing circuit integrated within the same substrate that houses the array of photoreceptors, controlling a timing of operation of said array of photoreceptors; and a circuit, integrated on said substrate, which reduces a fixed pattern noise, including at least two charge storage devices, one controlled by said timing circuit to first sample a level indicative of reset, and another controlled by said timing circuit to second sample a level indicative of a charged device.

11. A camera device as in claim 10, further comprising a shorting element that shorts together said two charge storage devices prior to sampling said reset level.

12. A camera device as in claim 10, wherein said timing circuit allows changing an integration time for said array of photoreceptors by changing a time between said first sample and said second sample.

13. A camera device as in claim 10, wherein said timing circuit times an operation of said fixed pattern noise reduction circuit to occur during a time of the video signal which is not being displayed.

14. A single chip camera device, comprising:

a substrate, having integrated thereon an image acquisition portion and a control portion, both of which are formed using a logic family that is compatible with CMOS;

said image acquisition portion integrated in said substrate including an array of photoreceptors arranged in rows and columns;

a charge storage element, associated with each said column;

said control portion integrated in said substrate including a signal controlling device, controlling said photoreceptors to output their signals, said control portion also including, integrated in said substrate, a timing circuit integrated within the same substrate that houses the array of photoreceptors, controlling a timing of operation of said array of photoreceptors;

said control portion including logic elements to control a double delta sampling, integrated on the chip, which shorts sampled signals during the readout cycle, thereby reducing column fixed pattern noise.

15. A camera device as in claim 14, wherein said signal controlling device includes a column-parallel read out device, which reads out a row of said photoreceptors at substantially the same time.

16. A camera device as in claim 14, wherein said signal controlling device includes a column selector allowing selection of a desired column for read out, and a row selector which allows selection of a desired row for readout.

17. A camera device as in claim 14, wherein said array of photoreceptors includes an active pixel sensor, where each element of the array includes both a photoreceptor and a readout amplifier integrated within the same substrate as the photoreceptor.

18. A camera device as in claim 17, wherein said readout amplifier is preferably within and/or associated with one element of the array.

19. A camera device as in claim 17, wherein said photoreceptors are photodiodes.

20. A camera device as in claim 17, wherein said photoreceptors are photogates.

21. A camera device as in claim 14, further comprising a mode selector device, selecting a mode of operation of said chip.

22. A camera device as in claim 21, wherein said photoreceptors are either photogates or photodiodes, and said mode selector device selects a first mode of operation for operation with photogates, and a second mode of operation, different than said first mode of operation, for operation with photodiodes.

23. A camera device as in claim 14, wherein said timing circuit allows changing an integration time for said array of photoreceptors.

24. A single chip camera device, comprising:

a substrate, having integrated thereon an image acquisition portion and control portion, both of which are formed using a logic family that is compatible with CMOS;

said image acquisition portion integrated in said substrate including an array of photoreceptors in rows and columns;

first and second charge storage elements, associated with each said column;

said control portion integrated in said substrate including a signal controlling device, said control portion also including, integrated in said substrate, a timing circuit integrated within the same substrate that houses the array of photoreceptors, controlling a timing of operation of said array of photoreceptors, controlling said photoreceptors to output their signals such that said first charge storage element receives the signal indicative of reset and said second charge storage element receives a signal indicative of a charged state;

said control portion including a shorting element, formed on said substrate which shorts between said first and second charge storage elements to reduce noise produced thereby.

25. A device as in claim 24, wherein said photoreceptors are controlled to read out an entire column of information at one time, wherein there are one of said first and second charge storage elements on said substrate for each element of said column, and wherein there is one of said shorting elements on said substrate for each of said columns.

26. A camera device as in claim 24, wherein said array of photoreceptors includes an active pixel sensor, where each element of the array includes both a photoreceptor and a readout amplifier integrated within the same substrate as the photoreceptor.

27. A camera device as in claim 26, wherein said readout amplifier is preferably within and/or associated with one element of the array.

28. A camera device as in claim 26, wherein said photoreceptors are photodiodes.

29. A camera device as in claim 26, wherein said photoreceptors are photogates.

30. A camera device as in claim 24, wherein said timing circuit allows changing an integration time for said array of photoreceptors with changing timings of said first and second charge storage elements.

31. A method of controlling a single chip camera, comprising:

integrating, on a single substrate, an image acquisition portion and a control portion, both of which are formed using a logic family that is compatible with CMOS, said image acquisition portion integrated in said substrate including an array of photoreceptors with output nodes, and a signal controlling device, controlling said photoreceptors and a timing circuit integrated within the same substrate that houses the array of photoreceptors, controlling a timing of operation of said array of photoreceptors, and also integrating at least two charge storage elements on said substrate;

first, shorting together specified nodes of said two charge storage elements;

after said first shorting, sampling voltages on said charge storage elements, said voltages being related to one another.

32. A method as in claim 31, further comprising:

sampling a reset value as a first sample;

allowing said photoreceptors to accumulate charge, after resetting said output nodes;

sampling said output nodes after accumulating said charge, producing output signals indicative of a difference between said reset value and said sampled value after accumulating said charge.

33. A single chip camera device, comprising: a substrate, having integrated thereon an image acquisition portion and a control portion, both of which are formed using a logic family that is compatible with CMOS; said image acquisition portion integrated in said substrate including an array of photoreceptors and a noise reduction circuit;

said control portion integrated in said substrate including a signal controlling device, controlling said photoreceptors to output their signals;

said control portion also including, integrated in said substrate, a timing circuit integrated within the same substrate that houses the array of photoreceptors, controlling a timing of operation of said array of photoreceptors to output a plurality of outputs at a time and controlling an operation of said noise reduction circuit to occur during a time when signals are not being read from said array of photodetectors.

34. A device as in claim 33, wherein said control portion controls the timing to output a column of said array at any one time.

35. A device as in claim 33, wherein said noise reduction circuit includes a correlated double sampling circuit.

* * * * *

UNITED STATES PATENT AND TRADEMARK OFFICE
CERTIFICATE OF CORRECTION

| | | |
|---|---|---|
| PATENT NO. | : 6,570,617 B2 | Page 1 of 1 |
| APPLICATION NO. | : 09/753417 | |
| DATED | : May 27, 2003 | |
| INVENTOR(S) | : Fossum et al. | |

It is certified that error appears in the above-identified patent and that said Letters Patent is hereby corrected as shown below:

Column 1, at the end of line 11, insert --and claims priority from provisional application no 60/010,678 having a filing date of January 26, 1996.--

Signed and Sealed this

Twelfth Day of May, 2009

JOHN DOLL
*Acting Director of the United States Patent and Trademark Office*